US009389365B2

(12) United States Patent
Nicholson et al.

(10) Patent No.: US 9,389,365 B2
(45) Date of Patent: Jul. 12, 2016

(54) SINGLE LASER MULTI-FREQUENCY TRANSMITTER

(71) Applicant: RANOVUS INC., Toronto (CA)

(72) Inventors: David John Nicholson, Ottawa (CA); Dylan Logan, Ottawa (CA); Douglas J. S. Beckett, Kanata (CA); Jeffrey Otha Hutchins, Sunnyvale, CA (US)

(73) Assignee: RANOVUS INC., Ottawa, Ontario (CA)

( * ) Notice: Subject to any disclaimer, the term of this patent is extended or adjusted under 35 U.S.C. 154(b) by 204 days.

(21) Appl. No.: 14/273,240

(22) Filed: May 8, 2014

(65) Prior Publication Data
US 2015/0323743 A1    Nov. 12, 2015

(51) Int. Cl.
*G02B 6/28* (2006.01)
*G02B 6/12* (2006.01)
*H01S 5/00* (2006.01)
*G02B 6/293* (2006.01)
*H01S 5/14* (2006.01)
*H04B 10/00* (2013.01)
*H04B 10/50* (2013.01)

(52) U.S. Cl.
CPC ........ *G02B 6/29338* (2013.01); *G02B 6/12007* (2013.01); *G02B 6/2938* (2013.01); *G02B 6/29341* (2013.01); *G02B 6/29343* (2013.01); *H01S 5/142* (2013.01); *H01S 5/0078* (2013.01); *H01S 5/0085* (2013.01); *H04B 10/00* (2013.01); *H04B 10/506* (2013.01)

(58) Field of Classification Search
None
See application file for complete search history.

(56) References Cited

U.S. PATENT DOCUMENTS

| 6,009,115 | A  | * | 12/1999 | Ho       | B82Y 20/00  |
|           |    |   |         |          | 372/20      |
| 6,643,421 | B1 | * | 11/2003 | Chin     | G02B 6/12007|
|           |    |   |         |          | 385/15      |
| 6,891,865 | B1 | * | 5/2005  | Ma       | H01S 5/141  |
|           |    |   |         |          | 372/20      |
| 7,701,983 | B2 | * | 4/2010  | Suzuki   | G02B 6/12007|
|           |    |   |         |          | 372/20      |
| 8,032,027 | B2 | * | 10/2011 | Popovic  | G02B 6/12007|
|           |    |   |         |          | 398/82      |
| 2003/0002099 | A1 | * | 1/2003 | Sayyah  | H04B 10/25752|
|           |    |   |         |          | 398/79      |
| 2003/0185490 | A1 | * | 10/2003 | Lopes  | G02B 6/29341|
|           |    |   |         |          | 385/16      |
| 2008/0232409 | A1 | * | 9/2008 | Yamazaki | G02B 6/12004|
|           |    |   |         |          | 372/20      |

(Continued)

OTHER PUBLICATIONS

"A 33mW 100 Gbps CMOS Silicon Photonic WDM Transmitter Using Off-Chip Laser Sources", Xuezhe Zheng, et al., Optical Fiber Communication Conference and Exposition and the National Fiber Optic Engineers Conference (OFC/NFOEC), Mar. 17-21, 2013.

(Continued)

*Primary Examiner* — Jerry Rahill
(74) *Attorney, Agent, or Firm* — Perry + Currier, Inc.

(57) ABSTRACT

A single laser multi-frequency transmitter is provided, comprising: a laser generating given modes; an optical input bus; a common optical output bus; coupling optics coupling the laser to the optical input bus; a plurality of ring resonator filters: arranged in series along the optical input bus in a one-to-one relationship with a sub-band of the given modes; optically coupled to both the optical input bus and the common optical output bus; and each configured to couple one respective frequency from the sub-band to the common optical output bus; and, a plurality of ring resonator modulators: arranged in series along the common optical output bus in a one-to-one relationship with the plurality of ring resonator filters; and each configured to modulate one given respective frequency from the sub-band so that all modes in the sub-band are modulated on the common optical output bus.

20 Claims, 9 Drawing Sheets

(56) References Cited

U.S. PATENT DOCUMENTS

2010/0098372 A1* 4/2010 Manipatruni ...... G02B 6/12007
  385/2
2011/0310917 A1 12/2011 Krishnamoorthy et al.

OTHER PUBLICATIONS

Cascaded siliconmicro-ring modulators for WDM optical interconnection by Qianfan Xu, Brad Schmidt, Jagat Shakya, and Michal Lipson Oct. 2, 2006 / vol. 14, No. 20 / Optics Express, p. 9431-9435.

Ultralow Power 80 Gb/s Arrayed CMOS Silicon Photonic Transceivers for WDM Optical Links Xuezhe Zheng, Frankie Y. Liu, Jon Lexau, Dinesh Patil, Guoliang Li, Ying Luo, Hiren D. Thacker, Ivan Shubin, JinYao, Kannan Raj, RonHo, John E.Cunningham, and Ashok V. Krishnamoorth, OSA 4, Journal of Lightwave Technology, vol. 30, No. 4, Feb. 15, 2012, pp. 641-650.

A WDM Silicon Photonic Transmitter Based on Carrier-Injection Microring Modulators Chin-Hui Chen, Cheng Li, Ayman Shafik, Marco Fiorentino, Patrick Chiang, Samuel Palermo, Raymond Beausoleil, http://www.hpl.hp.com/techreports/2014/HPL-2014-11.pdf, Posted on Feb. 21, 2014.

"Comb-laser driven WDM for short reach silicon photonic based optical interconnection", Andrew P Knights, Edgar Huante-Ceron, Jason Ackert, Dylan Logan, Greg Wojcik, Feng Zhang, Alexey Gubenko, Sergey Mikhrin, 2012 IEEE 9th International Conference on Group IV Photonics (GFP), Aug. 30, 2012, 210-212.

Powerpoint of "Comb-laser driven WDM for short reach silicon photonic based optical interconnection", Andrew P Knights, Edgar Huante-Ceron, Jason Ackert, Dylan Logan, Greg Wojcik, Feng Zhang, Alexey Gubenko, Sergey Mikhrin, Presented at 2012 IEEE 9th International Conference on Group IV Photonics (GFP), Aug. 30, 2012.

"A 33mW 100 Gbps CMOS Silicon Photonic WDM Transmitter Using Off-Chip Laser Sources", Xuezhe Zheng, et al., Optical Society of America, OFC/NFOEC Pstdeadline Papers.

Extended European Search Report, dated Sep. 29, 2015, issued in corresponding EP Application No. 15166630.2, filed May 6, 2015.

Grifferl, G.: "Vernier Effect in Asymmetrical Ring Resonator Array", IEEE Photonics Technology Letters, IEEE Service Center, Piscataway, NJ, US, vol. 12, No. 12, Dec. 1, 2000, pp. 1642-1644.

* cited by examiner

SINGLE LASER MULTI-FREQUENCY TRANSMITTER

FIELD

The specification relates generally to optical communications, and specifically to a single laser multi-frequency transmitter.

BACKGROUND

Multi-wavelength/multi-frequency optical transmitters used, for example, in telecommunications and/or data communications systems generally use one laser for each frequency, and the frequencies are multiplexed either before or after modulation using a multiplexer. Such multiple laser transmitters are large, costly, and complex to manufacture, and have high power consumption. Furthermore, multiplexers add loss to the optical path, impacting performance by reducing output power.

SUMMARY

The present specification provides a single laser multi-frequency transmitter, which uses a quantum dot or quantum dash device, and the like, as the laser. The spectrum of the laser is filtered by ring resonator filters onto a common optical output bus, one filter for each frequency that is to be modulated. Ring resonator modulators on the common optical output bus are controlled to modulate the frequencies. Hence, the transmitter is free of multiplexers.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

Furthermore, as will become apparent, in this specification certain elements may be described as connected physically, electronically, or any combination thereof, according to context. In general, components that are electrically connected are configured to communicate (that is, they are capable of communicating) by way of electric signals. According to context, two components that are physically coupled and/or physically connected may behave as a single element. In some cases, physically connected elements may be integrally formed, e.g., part of a single-piece article that may share structures and materials. In other cases, physically connected elements may comprise discrete components that may be fastened and/or assembled together in any fashion. Physical connections may also include a combination of discrete components fastened and/or together, and components fashioned as a single piece.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

In this specification, reference will be made to modes, frequencies and wavelengths. In general, a mode comprises an optical signal that is about centred on a given frequency and/or on a given wavelength, each mode having a bandwidth in both frequency space and wavelength space. Hence, a frequency of a mode comprises a frequency at which the mode is about centred, and a wavelength of a mode comprises a wavelength corresponding to the frequency. In some instances the term mode can be used interchangeably with the term frequency, which refers to the frequency at which the mode is about centred; and in other instances, the term mode can be used interchangeably with the term wavelength, which refers to the corresponding wavelength.

An aspect of the specification provides a system comprising: a laser generating given modes; an optical input bus; a common optical output bus; coupling optics coupling the laser to the optical input bus; a plurality of ring resonator filters: arranged in series along the optical input bus in a one-to-one relationship with a sub-band of the given modes; optically coupled to both the optical input bus and the common optical output bus; and each configured to couple one respective mode from the sub-band to the common optical output bus; and, a plurality of ring resonator modulators: arranged in series along the common optical output bus in a one-to-one relationship with the plurality of ring resonator filters; and each configured to modulate one given respective mode from the sub-band so that all modes in the sub-band are modulated on the common optical output bus.

Each of the plurality of ring resonator filters and each of the plurality of ring resonator modulators can comprise one or more ring resonators.

A respective free spectral range (FSR) of each of the plurality of ring resonator filters can be greater than a spectral bandwidth of the modes on the optical input bus that reach of the plurality of ring resonator filters from the coupling optics.

The plurality of ring resonator filters can be configured to de-interleave the modes of the laser and the sub-band of the given modes can comprise de-interleaved modes of the laser.

A respective free spectral range (FSR) of each of the plurality of ring resonator modulators can be greater than a spectral bandwidth of modes provided by of the plurality of ring resonator filters.

The coupling optics can comprise an optical filter that blocks modes other than the sub-band of the given modes.

The system can further comprise, a plurality of further ring resonator filters that block modes other than the sub-band of the given modes, the plurality of further ring resonator filters located between the coupling optics and the plurality of ring resonator filters.

Each of the plurality of ring resonator filters can comprise one or more optical ring resonators. Each of the plurality of ring resonator filters can comprise a respective bandwidth configured to couple the one respective mode from the sub-band to the common optical output bus. The respective bandwidth can be further configured to isolate the one respective mode from the sub-band.

Each of the plurality of ring resonator filters can comprise a tunable Vernier filter comprising a respective first filter having a first free spectral range (FSR) and a respective second filter having a second FSR different from the first FSR, a combined FSR of the tunable Vernier filter being greater than a spectral bandwidth of the modes of the laser. The second filter can be coupled to the first filter using one or more of a drop port of the first filter and a waveguide. Combined FSR (FSR_vern) of the tunable Vernier filter can comprise: $FSR\_vern = M1 \times FSR1 = M2 \times FSR2$, where FSR1 is the first FSR, FSR2 is the second FSR, and each of M1 and M2 are different co-prime integers. M2 can be equal to M1+1.

The laser can comprise a quantum dot laser or a quantum dash laser.

The modes of the laser can align with a given channel of one or more of a telecommunication standard, a telecommunication specification, a data communication standard, and a data communication specification.

The optical input bus, the common optical output bus, the plurality of ring resonator filters, and the plurality of ring resonator modulators can be formed from a common photonic integrated circuit (PIC).

The system can further comprise at least one respective tuning apparatus for each of the plurality of ring resonator filters and the plurality of ring resonator modulators.

Each at least one tuning apparatus can comprise one or more of: at least one temperature control apparatus, at least one photodetector for optical signal sensing, at least one heater, at least one integrated heater, at least one cooler, and at least one thermoelectric cooler.

The system can further comprise an optical output device connected to the common optical output bus, the optical output device configured to convey an optical output signal to one or more of an optical component, an optical fiber, an SOA (Semiconductor Optical Amplifier), a PIC (photonic integrated circuit), and an optical filter.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
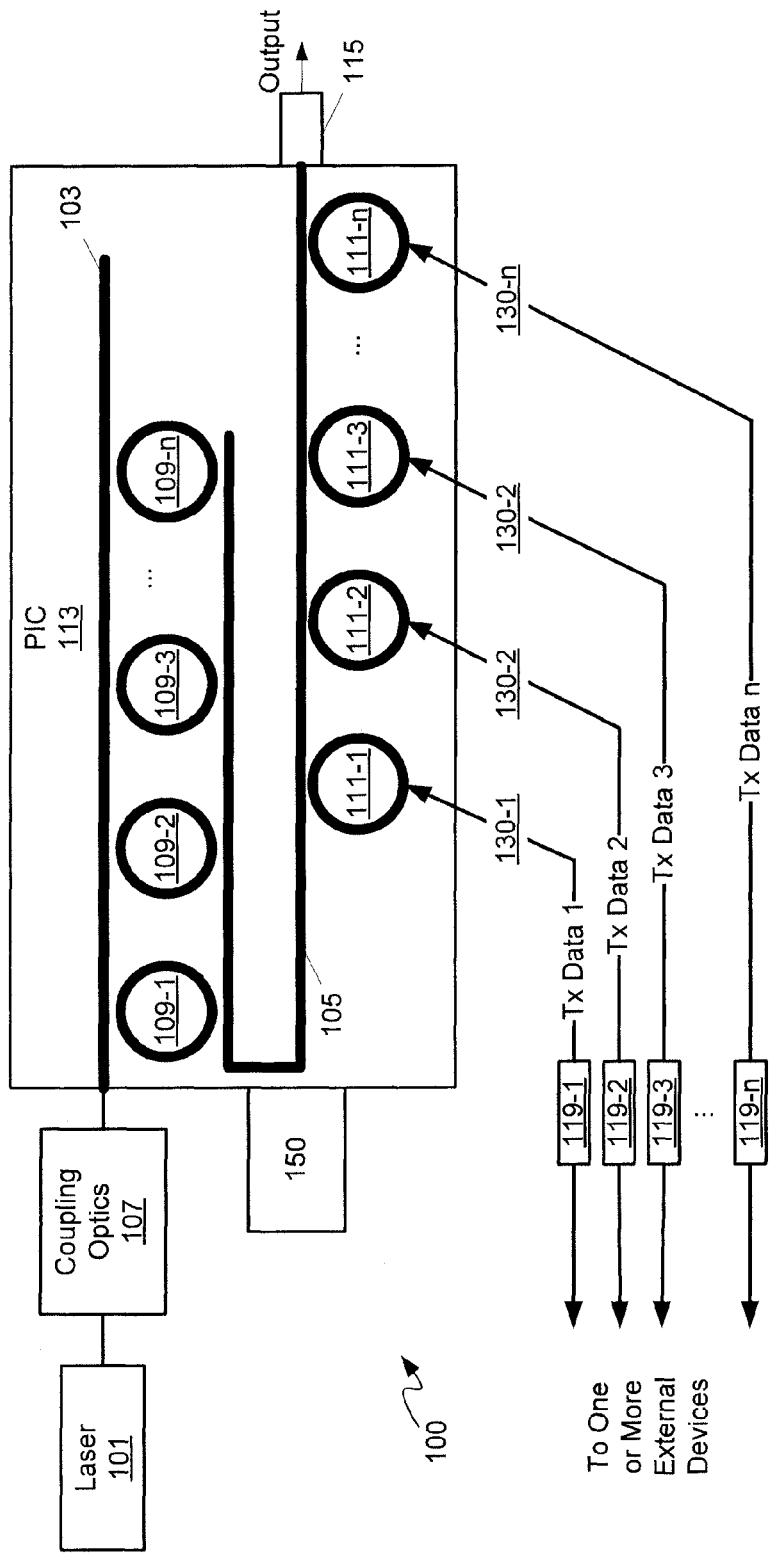
FIG. 1 depicts a system including a single laser multi-frequency transmitter, according to non-limiting implementations.

FIG. 1 depicts a system 100 comprising: a laser 101 generating given modes; an optical input bus 103; a common optical output bus 105; coupling optics 107 coupling the laser to the optical input bus; a plurality of ring resonator filters 109-1, 109-2, 109-3 . . . 109-$n$: arranged in series along optical input bus 103 in a one-to-one relationship with a sub-band of the given modes; optically coupled to both optical input bus 103 and common optical output bus 105; and each configured to couple one respective mode from the sub-band to common optical output bus 105; and, a plurality of ring resonator modulators 111-1, 111-2, 111-3 . . . 111-$n$ arranged in series along common optical output bus 105 in a one-to-one relationship with plurality of ring resonator filters 109-1, 109-2, 109-3 . . . 109-$n$; and each configured to modulate one given respective mode from the sub-band so that all modes in the sub-band are modulated on common optical output bus 105, as described in further detail below.

Plurality of ring resonator filters 109-1, 109-2, 109-3 . . . 109-$n$ will be interchangeably referred to hereafter, collectively, as filters 109 and generically as a filter 109. Similarly, plurality of ring resonator modulators 111-1, 111-2, 111-3 . . . 111-$n$ will be interchangeably referred to hereafter, collectively, as modulators 111 and generically as a modulator 111.

System 100 can further comprise a photonic integrated circuit (PIC) 113 which in turn can comprise optical input bus 103, common optical output bus 105, filters 109 and modulators 111. In other words, optical input bus 103, common optical output bus 105, filters 109 and modulators 111 can be formed from a common PIC.

System 100 can further comprise an optical output device 115 connected to common optical output bus 105, optical output device 115 configured to convey an optical output signal to one or more of an optical component, an optical fiber, an SOA (Semiconductor Optical Amplifier), a PIC (e.g. different from PIC 113 and/or other components on PIC 113), and an optical filter. Optical output device 115 can comprise one or more of a waveguide coupler, an optical coupler, an optical output coupler, an optical interface, a fiber optic coupler, a fiber optic connector, and the like. Alternatively, one or more of optical output device 115 can comprise an output to other PICs and/or other circuits within PIC 113. While not depicted, an input to optical input bus 103 can comprise one or more of a waveguide coupler, an optical coupler, an optical input coupler, and an optical interface.

As depicted system 100 can further comprise one or more modulator amplifiers 119-1, 119-2, 119-3 . . . 119-$n$ to control modulation of modulators 111, for example one modulator amplifier 119-1, 119-2, 119-3 . . . 119-$n$ for each modulator 111 in a one to one relationship. Modulator amplifiers 119-1, 119-2, 119-3 . . . 119-$n$ are interchangeably referred to hereafter, collectively, as amplifiers 119 and, generically, as an amplifier 119. Amplifiers 119 are in communication with each modulator 111 using a respective link 130-1, 130-2, 130-3 . . . 130-$n$ to convey respective transmission data, referred to in FIG. 1 as Tx Data 1, Tx Data 2, Tx Data 3 . . . Tx Data n, to a respective modulator 111 in the form of a modulating signal; the modulating signal controls a respective modulator 111 to modulate a respective optical frequency/mode to encode respective transmission data therein. Links 130-1, 130-2, 130-3 . . . 130-$n$ will be interchangeably referred to hereafter, collectively, as links 130 and generically as a link 130. Links 130 can each comprise cables, electrical lines, electrical connectors and the like.

In general, amplifiers 119 are configured for communication with one or more external devices, for example from which data for transmission is received; for example data is received from one or more telecommunications devices and/or data communications devices which in turn received the data from computing devices and/or communications devices associated with entities and/or users, the data including, but not limited to, one or more of voice, audio, video, images, web data, browser data, email data, message data and the like. Amplifiers 119 receive the data and convert the data to signal which control modulators 111 to modulate respective modes on common optical output bus 105 for transmission.

System 100 can further comprise one or more computing devices 150 for tuning filters 109 and modulators 111 including, but not limited to, a micro-controller, and integrated circuit (IC), an IC that performs A/D (analog to digital) and D/A (digital to analog) conversions, and/or a combination, and the like. For example, the one or more computing devices 150 can communicate with each filter 109 to control a respective frequency that is coupled by a filter 109 from optical input bus 103 to common optical output bus 105, and/or to tune a respective filter 109. The one or more computing devices 150 can further communicate with each modulator 111 to control a respective frequency that is modulated by a modulator 111 on common optical output bus 105. Connections and/or links between one or more computing devices 150 and filters 109/ modulators 111 are not depicted for clarity, but are appreciated to be nonetheless present. Computing devices 150 can further comprise one or more memories for storing operating instructions and one or more interfaces for communicating with filters 109 and modulators 111.

Together, laser 101, coupling optics 107, optical input bus 103, filters 109, common optical output bus 105, and modulators 111 are components of a single laser multi-frequency transmitter that is generally configured to generate and transmit modulated optical signals, for example at optical carrier frequencies. Hence, in some implementations, optical output device 115 couples the transmitter to one or more optical fibers so that modulated optical signals on various carrier frequencies can be transmitted to one or more receivers to convey optical data through an optical communication system, including but not limited to one or more of voice, audio, video, images, web data, browser data, email data, message data and the like.

Laser 101 comprises a laser that can generate multiple modes at a frequency spacing and can include, but is not limited to, a quantum dot laser, a quantum dash laser and the like. In general, light emitting material for quantum dot lasers and/or quantum dash lasers can be selected and/or fabricated so that laser 101 emits light at specific frequencies and/or wavelengths. In some implementations, materials of laser 101 can be selected so that at least a portion of frequencies emitted by laser 101 correspond and/or align with one or more channels of a telecommunication standard, and a telecommunication specification; such standards and specifications can include, but are not limited to, standards and specifications for optical communications and data communications. In other words, the modes of laser 101 can align with a given channel of one or more of a telecommunication standard and a telecommunication specification. For example, in non-limiting implementations, laser 101 can emit light at optical carrier frequencies used in optical telecommunications in a range of about 184.5-238 THz; however other optical carrier frequencies are within the scope of present implementations.

In some of these implementations, materials and/or design of laser 101 can be selected so that at least a portion of the modes of laser 101 are irregularly spaced so that specific modes, corresponding to channels of one or more of a telecommunication standard and a telecommunication specification, can be output.

Coupling optics 107 comprises optical components that can couple an output of laser 101 to optical input bus 103 including, but not limited to, lenses, optical fibers, optical couplers and the like. PIC 113 can comprise one or more input couplers for coupling optical input bus 103 to coupling optics 107.

In some non-limiting implementations, as described below, coupling optics 107 can comprise an optical filter that blocks at least a portion of frequencies of laser 101 that do not belong to the sub-band of the given frequencies that are selected by filters 109 and modulated by modulators 111. For example, such an optical filter can block frequencies other than the sub-band of optical frequencies that are filters 109 couple to common optical output bus 105. In some implementations, the optical filter can comprise a dichroic filter.

In yet further implementations, system 100 can comprise a plurality of further ring resonator filters (for example see FIG. 5, described below), that block frequencies other than the sub-band of the given frequencies, the plurality of further ring resonator filters located between coupling optics 107 and plurality of ring resonator filters 109, for example arranged in series on optical input bus 103.

Each of optical input bus 103 and common optical output bus 105 can comprise a respective optical bus and/or a respective waveguide that can be formed in PIC 113 during manufacture. While optical input bus 103 is depicted as linear, in other implementations optical input bus 103 can be other shapes including, but not limited to, curved and the like. Similarly, while common optical output bus 105 is depicted as rectilinear, common optical output bus 105 can be other shapes including, but not limited to, curved and the like. Furthermore, while common optical output bus 105 is depicted as coupled and/or connected to optical output device 115 on a side of PIC 113 opposite coupling optics 107, common optical output bus 105 can be routed, during manufacture, to any output location at PIC 113 so that optical output device 115 can similarly be located at any position at PIC 113. In some implementations, system 100 can further comprise a device on optical input bus 103 configured to absorb and/or scatter frequencies not coupled to common optical output bus 105; in general, such a device prevents frequencies not coupled to common optical output bus 105 from being reflected back along optical input bus 103 to coupling optics 107 and/or laser 101.

Each filter 109 and each modulator 111 comprises one or more respective ring resonators that can be tuned using a respective tuning apparatus. For example, attention is directed to FIG. 2a which depicts a non-limiting example of a filter 109. Filter 109 comprises a ring resonator 201 and a tuning apparatus 203 configured to communicate with one or more computing devices 150 for controlling and/or tuning filters 109. Tuning apparatus 203 can be controlled using a link 215 to one or more computing devices 150. In other words, filter 109 can be controlled and/or tuned via one or more computing devices 150 controlling tuning apparatus 203, for example using a link 215 to one or more computing devices 150. Hence, one or more computing devices 150 can further comprise a memory storing data that defines power, and the like, corresponding to temperatures to which ring resonator 201 is be controlled to resonate a given frequency, the power and the like, that is to be output to tuning apparatus 203 by one or more computing devices 150.

Ring resonator 201 comprises a device which resonates at a frequency so that when ring resonator 201 is coupled to optical input bus 103, ring resonator 201 can couple the corresponding mode to common optical output bus 105. While ring resonator 201 is depicted as circular, as are filters 109, in other implementations ring resonator 201 (and/or one or more filters 109) can be other ring shapes including, but not limited to, oval, a racetrack shape, and the like; similar comments apply to other ring resonators described throughout this specification.

Figure 2A:
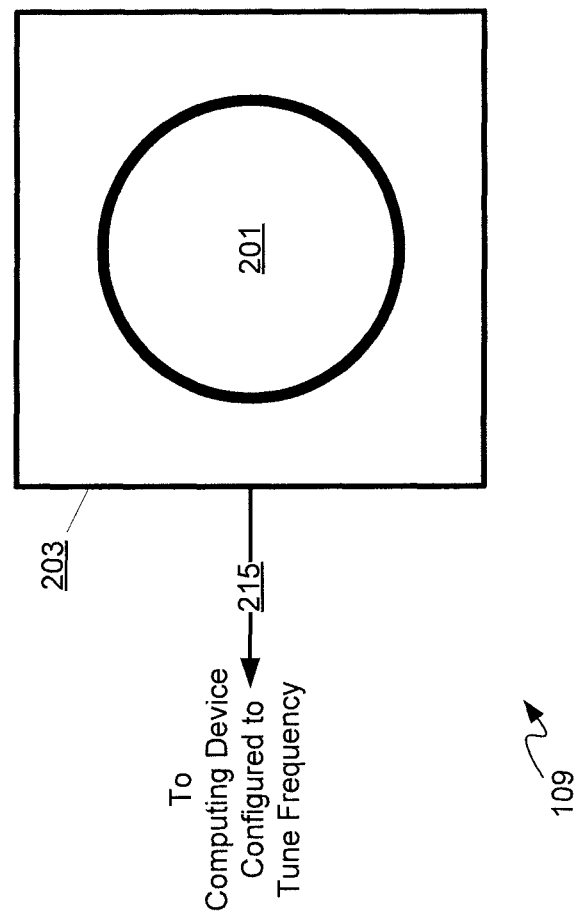
FIG. 2a depicts a schematic diagram of a filter of the system of FIG. 1, according to non-limiting implementations.

While FIG. 2a depicts only one ring resonator 201, in other implementations filter 109 can comprise a plurality of ring resonators which can be tuned, as a group, to resonate at a given frequency.

The frequency at which ring resonator 201 resonates depends on a circumference of ring resonator 201 and an index of refraction of ring resonator 201. Furthermore the frequency at which ring resonator 201 resonates can be tuned by changing a temperature of ring resonator 201. Hence, a frequency at which ring resonator 201 resonates can be coarsely controlled by controlling a circumference and/or refractive index of ring resonator 201 (e.g. during fabrication thereof) and finely controlled by controlling the temperature of ring resonator 201, for example using tuning apparatus 203, which changes the physical properties thereof, such as refractive index.

Hence, tuning apparatus 203 comprises one or more of: at least one temperature control apparatus, at least one photodetector for optical signal sensing, at least one heater, at least one integrated heater, at least one cooler, and at least one thermoelectric cooler. In other words, tuning apparatus 203 is used to control a temperature and/or physical properties of ring resonator 201; as a temperature of ring resonator 201 changes, physical properties of optical ring resonator 201 change, including, but not limited to, the index of refraction, thereby changing a frequency at which ring resonator 201 resonates. Hence, the frequency and/or mode that is coupled from optical input bus 103 to common optical output bus 105 can be selected by controlling the temperature of a filter 109.

In some implementations, tuning apparatus 203 can comprise an electrical tuning apparatus configured to tune ring resonator 201 to resonate at a given frequency using electrical fields, for example by electrically controlling an index of refraction of ring resonator 201. For example, in some implementations, tuning apparatus 203 can utilize other optical effects instead of temperature tuning, including but not limited to electrical effects, mechanical effects and the like, to tune ring resonator 201.

While tuning apparatus 203 is schematically depicted as square and/or rectangular, in other implementations, tuning apparatus 203 can be circular and/or integrated with ring resonator 201. Furthermore, tuning apparatus 203 can be integrated onto PIC 113 to affect change in a response of a filter 109 without influencing response of ring resonators in other filter 109.

In yet further implementations, tuning apparatus 203 can comprise a first heater for coarsely controlling a temperature of ring resonator 201 and a second heater for fine control of the temperature of ring resonator 201. In yet further implementations, as described above, coarse and/or fine control can be implemented using electrical and/or mechanical control.

Figure 2B:
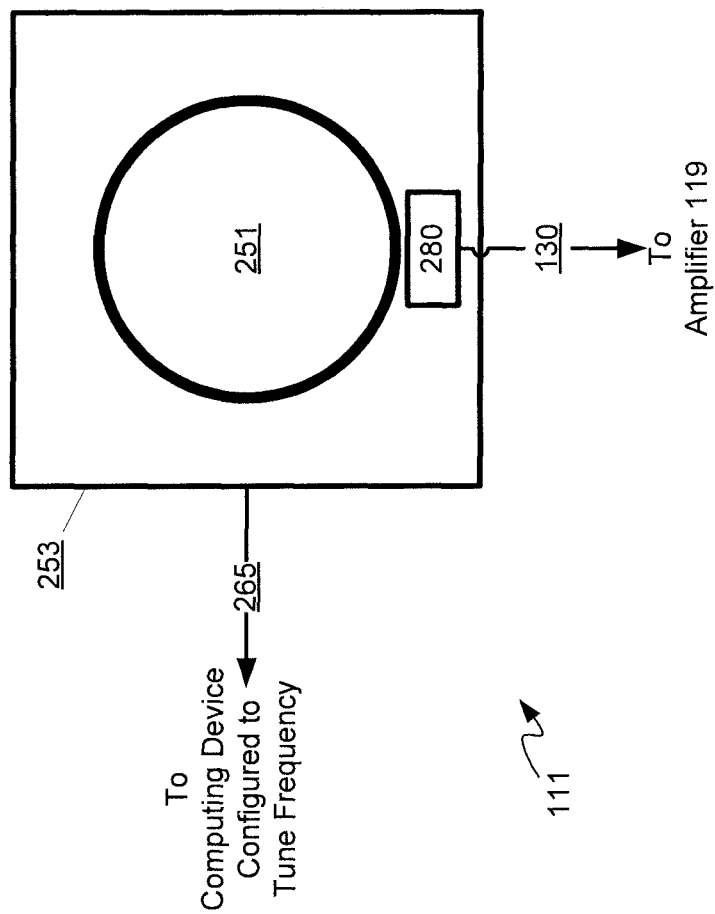
FIG. 2b depicts a schematic diagram of a modulator of the system of FIG. 1, according to non-limiting implementations.

Attention is next directed to FIG. 2b which depicts a non-limiting example of a modulator 111. Modulator 111 comprises a ring resonator 251 and a tuning apparatus 253 each respectively similar to ring resonator 201 and tuning apparatus 203. Further, tuning apparatus is controlled by one or more computing devices 150 using a link 265, similar to link 215.

However, in contrast to filters 109, modulators 111 further comprise a modulating apparatus 280 configured to control ring resonator 251 to modulate a given frequency on common optical output bus 105. Modulating apparatus 280 can be different from tuning apparatus 253, though each can be components of a PIC. Modulating apparatus 280 is in communication with a respective amplifier 119 using a link 130, as described above; modulating apparatus 280 receives electrical signals from a respective amplifier 119 with Tx Data encoded therein, and modulating apparatus 280 causes ring resonator 251 to modulate accordingly. In other words, tuning apparatus 253 tunes ring resonator 251 to resonate at a given frequency, and modulating apparatus 280 modulates the ring resonator 251 to, in turn, modulate a corresponding given mode on common optical output bus 105. For example, modulating apparatus 280 causes ring resonator 251 to alternate between resonating at the given frequency of the mode being modulated (thereby reducing the optical power of the corresponding given mode on common optical output bus 105, which can be interpreted as "0", for example a "0" in Tx Data) and moving the resonance away from the corresponding given mode being modulated (thereby increasing the optical power of the given mode on common optical output bus 105, which can be interpreted as a "1", for example a "1" in Tx Data).

Modulating apparatus 280 can include, but is not limited to a P-N junction of a diode that is laterally integrated onto an arc of the circumference of ring resonator 251. For example, while modulating apparatus 280 is depicted as rectangular and adjacent to ring resonator 251, in other implementations, modulating apparatus 280 can be at least partially arc shaped and at least partially overlapping with the ring resonator.

Connections to links 215, 265 and/or links 130 can occur using one or more of bond wires, traces on a PCB (printer circuit board), chip flip-chip mounted devices, and the like.

Hence, while not depicted in FIG. 1, system 100 further comprises at least one respective tuning apparatus 203 for each of the plurality of ring resonator filters 109 and one respective tuning apparatus 253 for each of the plurality of ring resonator modulators 111. Similarly, system 100 comprises a modulating apparatus 280 for each of modulators 111. As described above, each of the plurality of filters 109 and each of the plurality of modulators 111 comprises one or more ring resonators, though only one ring resonator is depicted for each filter 109 and each modulator 111 in FIG. 1.

Furthermore, in some implementations, system 100 can further comprise a heater and/or cooler for global temperature control of filters 109 and modulators 111. In other words, all of filters 109 and modulators 111 can be controlled to a given temperature by a common heater and/or common cooler and/or tuning apparatus, and a respective temperature of each of filters 109 and modulators 111 can be controlled using a respective tuning apparatus at each of filters 109 and modulators 111.

While four each of filters 109 and modulators 111 are depicted, as a non-limiting example of "n" filters 109 and "n" modulators 111, in other implementations, a number of filters 109 and modulators 111 can be more than four or less than four. However, filters 109 and modulators 111 are generally in a one-to-one relationship.

Furthermore, while as depicted modulators 111 are grouped together, between a last filter 109-n (i.e. a filter 109-n that is closest to optical output device 115 on common optical output bus 105) and optical output device 115, in other implementations, each modulator 111 is located between a corresponding filter 109 and optical output device 115. In other words, each filter 109 and modulator 111 are provided in pairs (i.e. in one-to-one relationship), a filter 109 of a pair coupling a given frequency to common optical output bus 105, and a corresponding modulator 111 of the pair modulating the given frequency. Hence each modulator 111 is located after a corresponding filter 109 of the pair and/or between a corresponding filter 109 and optical output device 115.

In some implementations, system 100 further comprises photodetectors configured to provide feedback for tuning filters 109 and/or modulators 111. For example, such a photodetector can be integrated with each tuning apparatus 203, 253 and/or integrated into PIC 113, and can be in communication with one or more computing devices 150 for controlling and/or tuning a resonance frequency of each of a respective filter 109 and/or modulator 111 using suitable links. The photodetectors detect signals associated with a resonance frequency of a respective filter 109 or modulator 111 and provide feedback to one or more computing devices 150; when the resonance frequency drifts, as determined by one or more computing devices 150, tuning apparatus 203, 253 can be controlled to return the resonance frequency to a target resonance frequency.

While also not depicted, system 100 further comprises: one or more power sources, including but not limited to, one or more connections to a power source, one or more connection to a main power supply, a battery, a backup battery, and the like.

In yet further implementations, components of system 100 can be integrated into a single device, which can in turn be integrated into an optical communication device for receiving and transmitting data along optical fibers in an optical communication system. Components of system 100 can be integrated into a single module and/or assembly as a pluggable device that can used in telecommunications and/or data communications racks.

In any event, it should be understood that a wide variety of configurations for system 100 are contemplated.

Figure 3:
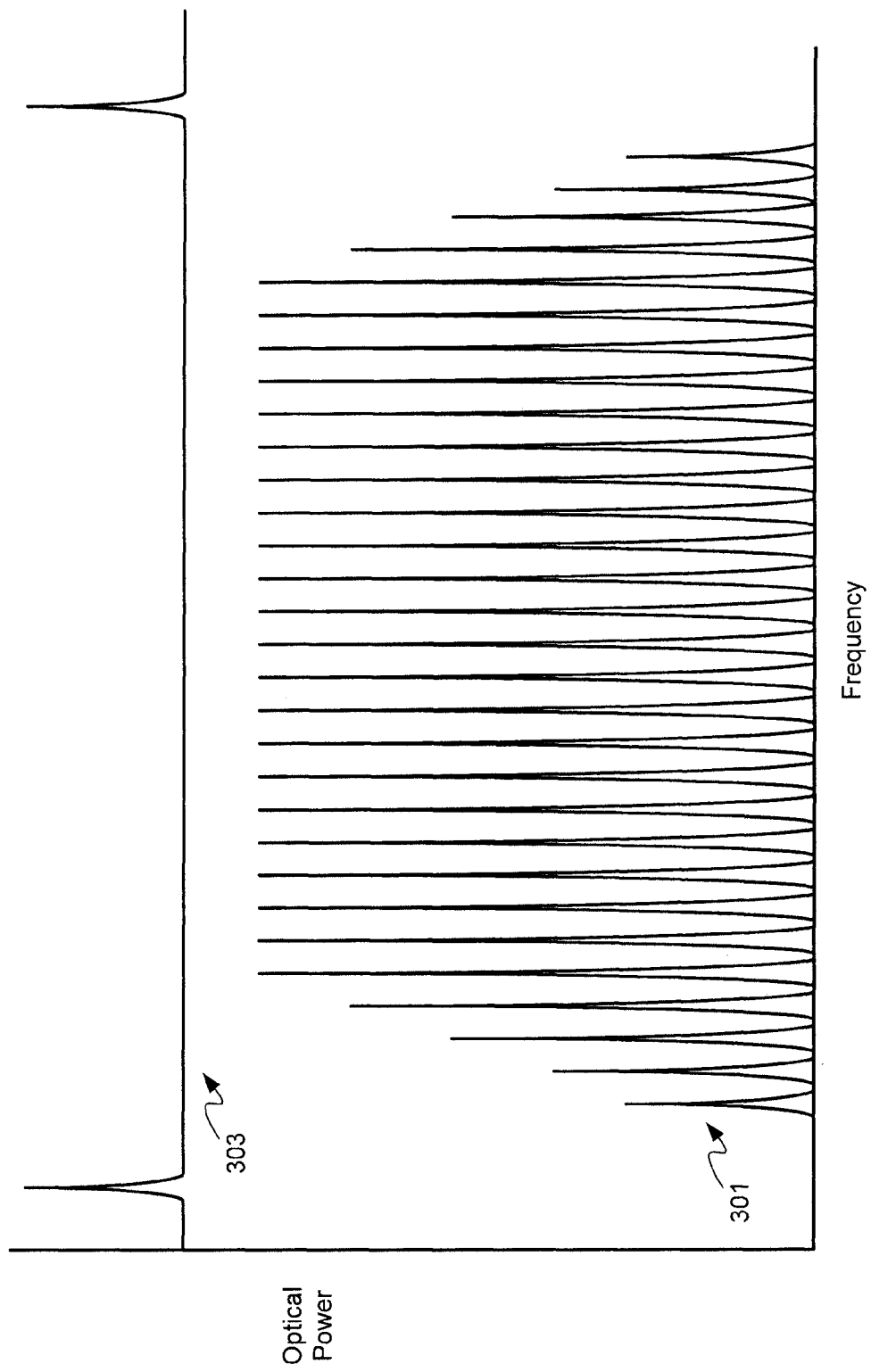
FIG. 3 depicts modes of the laser of FIG. 1, and a transfer function of a filter of FIG. 1, according to non-limiting implementations.

Attention is next directed to FIG. 3, which depicts a non-limiting example of an optical spectrum 301 of modes and/or frequencies output by laser 101; spectrum 301 is depicted with frequency on the x-axis and optical power on the y-axis each in arbitrary units. Each peak of spectrum 301 corresponds to a mode of laser 101. While spectrum 301 depicts the modes thereof as being regularly spaced in frequency, in other implementations, laser 101 can output modes that are not regularly spaced, for example by selecting materials and/or shaping (e.g. quantum dots and/or quantum dashes) accordingly and/or by using a grating in laser 101 to select given modes and/or by using a cavity design of laser 101 that generates irregularly spaced modes. Further, one or more of modes of optical spectrum 301 can correspond and/or align with a channel in a telecommunication standard and/or specification. A spectral bandwidth of laser 101 is defined by a difference between a highest-frequency mode and a lowest-frequency mode output by laser 101. Laser 101 can also output more or fewer modes than depicted in spectrum 301.

FIG. 3 further depicts an optical transfer function 303 showing a non-limiting example of a free spectral range (FSR) of one or more of filters 109. In other words, a filter 109 will have different resonance frequencies that correspond to integer multiples of a frequency at which a filter 109 resonates. The difference between two adjacent resonance frequencies is referred to as the free spectral range. Hence, transfer function 303 depicts two such resonant frequencies, and further the FSR of a filter 109 in these implementations is greater than the spectral bandwidth of the modes of laser 101 so that a given filter 109 can be tuned to resonate at only one frequency corresponding to a mode of laser 101. If the FSR of a given filter 109 were less than the spectral bandwidth of laser 101, then two (or more) modes of laser 101 could be aligned with modes of a given filter 109 and hence selected by the given filter 109.

While neither of the depicted resonant frequencies of transfer function 303 is depicted as aligning with a mode of spectrum 301, it is appreciated that the resonant frequencies of transfer function 303 are positioned to illustrate the width of the FSR of a filter 109 as compared to the spectral bandwidth of laser 101. Furthermore, it is assumed that one of the resonant frequencies of transfer function 303 can be aligned with a mode of spectrum 301 by tuning a filter 109 as described above.

Hence, by tuning each filter 109 to a different frequency of spectrum 301, for example so that one of the resonant frequencies of transfer function 303 align with one of the modes of spectrum 301, a sub-band of modes of spectrum 301 can be coupled from optical input bus 103 to common optical output bus 105.

Transfer function 303 further shows that each of plurality of ring resonator filters 109 comprises a respective bandwidth configured to couple the one respective mode of the sub-band to common optical output bus 105. In other words, the bandwidth of a resonant frequency in transfer function 303 is configured to couple one respective mode to common optical output bus 105. If the bandwidth of an aligned resonant frequency of transfer function 303 were to overlap with two modes of spectrum 301, one filter 109 would couple at least a portion of the two modes leading to cross-talk. Hence, bandwidth of filters 109 are generally designed and/or selected to couple one mode and/or frequency to common optical output bus 105. Similarly, a respective bandwidth can be further configured to isolate the one respective mode from the other modes, for example from other modes coupled to common optical output bus 305 and from other modes on optical input bus 103.

In implementations where spectrum 301 has a regular spacing between modes, filters 109 can be used to de-interleave modes from optical input bus 103. In other words, with a laser spectrum with mode spacing M, filters 109 can couple mode spaced at L*M from optical input bus 103 to common optical output bus 105, where L is an integer, with each filter 109 coupling one mode from optical input bus 103 to common optical output bus 105. For example, assuming that laser 101 is configured to output modes having a spacing of M=50 GHz, filters 109 can be configured to couple every other mode (L=2) to produce modulated channels spaced at 100 GHz. Hence, in these implementations, filters 109 couple non-adjacent modes from spectrum 301 from optical input bus 103 to common optical output bus 105.

Figure 4A:
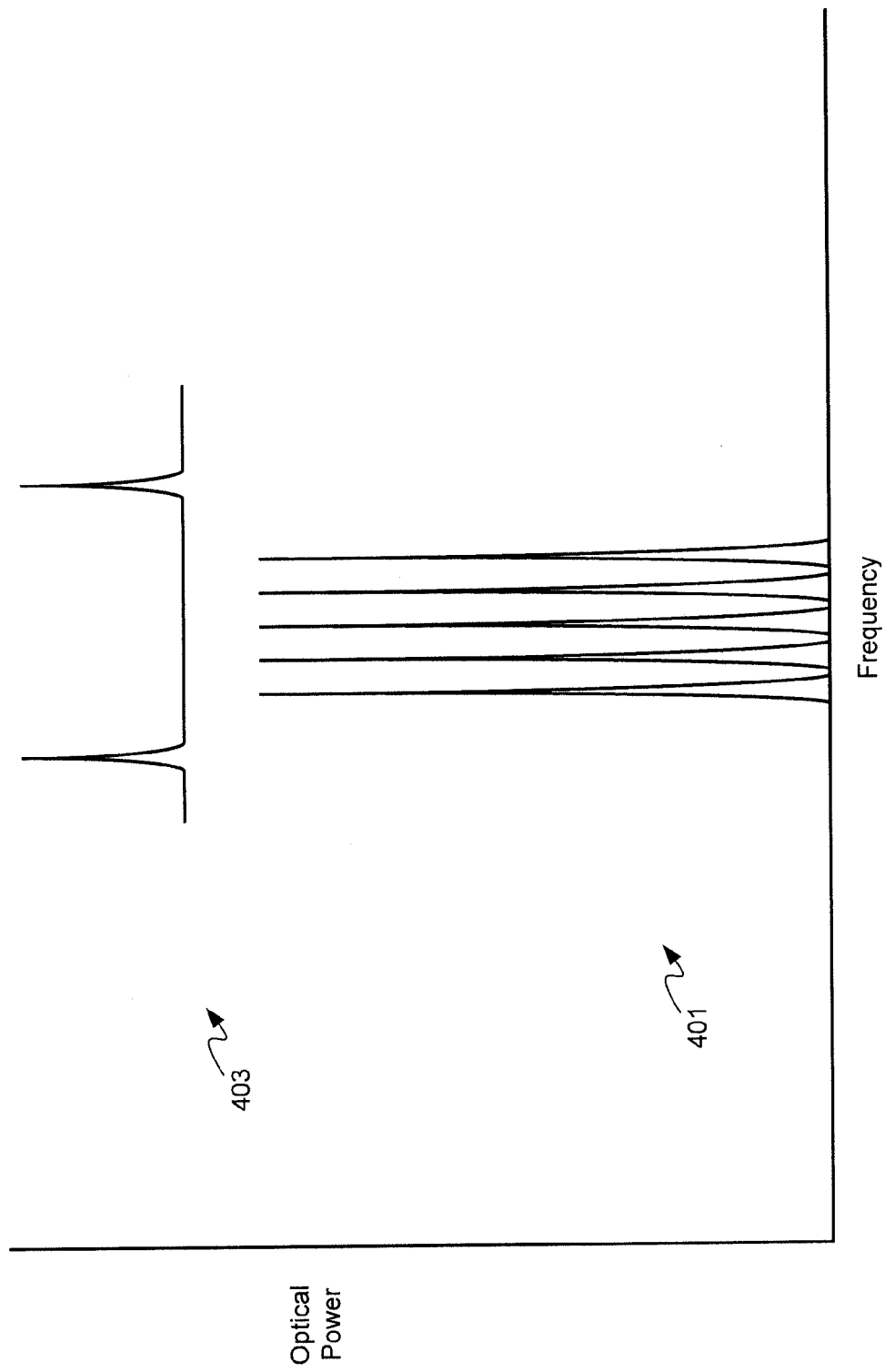
FIG. 4a depicts modes of the laser of FIG. 1, when filtered by the coupling optics and/or by further filters, and a transfer function of a filter of FIG. 1, according to non-limiting implementations.

Attention is next directed to FIG. 4a, which depicts a non-limiting example of an optical spectrum 401 of modes output by laser 101 in implementations that include an optical filter at coupling optics 107, and is otherwise similar to FIG. 3. Each peak of spectrum 401 corresponds to a mode of laser 101, as in spectrum 301 of FIG. 3, but the optical filter in coupling optics 107 has removed and/or blocked all modes except those corresponding to a sub-band of given frequencies from which filters 109 are configured to couple a selection of modes to common optical output bus 105. For example, spectrum 401 comprises five modes and, it is assumed in FIG. 4a that the remaining modes of laser 101, as depicted in spectrum 301, have been filtered out by an optical filter of coupling optics 107. Hence, spectrum 401 comprises spectrum 301 with all modes other than the depicted five modes filtered out, for example a sub-band of "m" modes (where m=5 in depicted non-limiting implementations), which is greater than a number "n" of filters 109. In other words, spectrum 401 represents "m" modes on optical input bus 103 that reach filters 109 on optical input bus 103, and spectral bandwidth of such modes can be less than a spectral bandwidth of laser 101. While adjacent modes are depicted as reaching filters 109 in FIG. 4a, in other implementations the optical filter can block modes that are not adjacent.

Hence, in general, there are more modes on optical input bus 103 than filters 109, and filters 109 couple a sub-band of the modes that reach filters 109 on optical input bus 103 to common optical output bus 105. The modes on optical input bus 103 that are not coupled to common optical output bus 105 can be scattered and/or absorbed and the like by a device on optical input bus 103 configured to prevent modes not coupled to common optical output bus 105 from being reflected back along optical input bus 103 to coupling optics 107 and/or laser 101.

FIG. 4a also depicts a transfer function 403 showing an FSR of a filter 109 for filtering modes of spectrum 301, the FSR of the filter 109 being greater than a spectral bandwidth of the modes on optical input bus 103 that reach the plurality of ring resonator filters 109 from coupling optics 107. As compared to transfer function 303, the filter 109 represented by transfer function 403 can have a smaller FSR than the filter 109 represented by transfer function 303, as the spectral bandwidth of spectrum 401 is smaller than the spectral bandwidth of spectrum 301. However, in other implementations, a filter 109 for spectrum 401 can have an FSR that is similar to the FSR represented by transfer function 303.

In implementations where a plurality of further ring resonators (as in FIG. 5, described below) on optical input bus 103 provides filtering similar to the optical filter that produces spectrum 401, spectrum 401 can be produced by the plurality of further ring resonators.

In general, regardless of whether any pre-filtering occurs at coupling optics 107 and/or using further ring resonators, a respective FSR of each of plurality of ring resonator filters 109 is greater than a spectral bandwidth of the modes on optical input bus 103 that reach plurality of ring resonator filters 109 from coupling optics 107.

As depicted, spectrum 401 comprise five frequencies, however spectrum 401 can comprise more or fewer frequencies, depending on filtering of the optical filter and/or the plurality of further ring resonator filters. A number of filters 109 is generally less than a number of modes in spectrum 401.

Hence, presuming that system 100 comprises four filters 109, each of filters 109 can be tuned to a respective frequency of spectrum 401 so that a sub-band of modes of spectrum 401 is coupled from optical input bus 103 to common optical output bus 105.

Alternatively, when spectrum 301 comprises the input to filters 109, each of the four filters 109 can couple a respective mode of spectrum 301 from optical input bus 103 to common optical output bus 105.

Figure 4B:
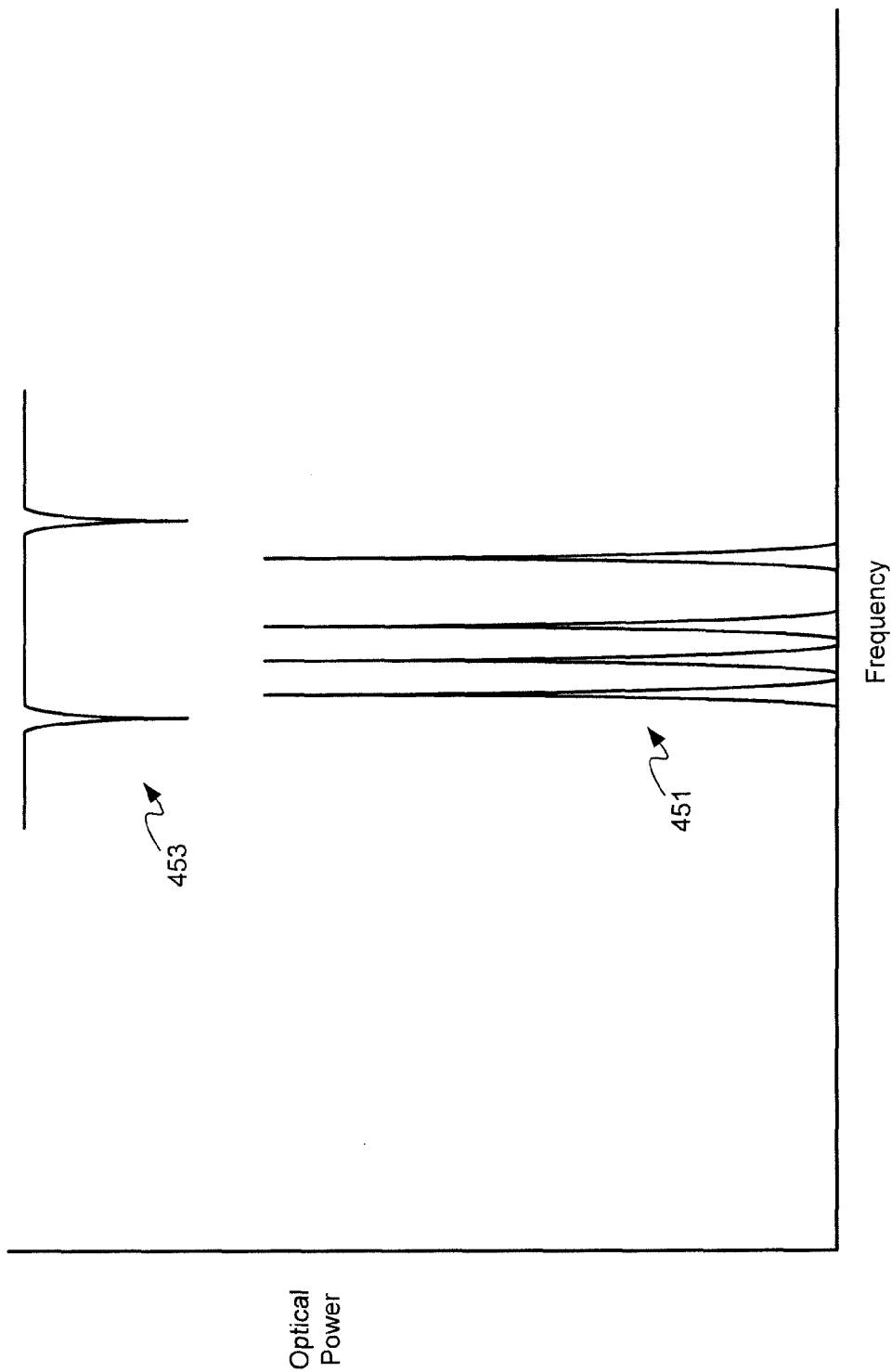
FIG. 4b depicts modes coupled to a common optical output bus of the system of FIG. 1, and a transfer function of a modulator of FIG. 1, according to non-limiting implementations.

Hence, in general, each filter 109 couples one respective mode and/or frequency from optical input bus 103 to common optical output bus 105. For example, attention is next directed to FIG. 4b which depicts an example non-limiting spectrum 451 of a sub-band of frequencies that have been coupled to common optical output bus 105 by each of four filters 109 resulting in four modes in spectrum 451. In other words, spectrum 451 represents a sub-band of modes or frequencies on common optical output bus 105. As depicted not all of modes in spectrum 451 comprises modes that were adjacent in spectra 301 and/or 401; hence filters 109 can be used to couple non-adjacent modes to common optical output bus 105. FIG. 4b further depicts a transfer function 453 of a modulator with an FSR that is greater than a spectral bandwidth of spectrum 451 so that one valley of transfer function 453 can be tuned and/or aligned to one of modes of spectrum 451, using tuning apparatus 253, and modulate the aligned mode, using modulating apparatus 280. In other words, a respective FSR of each of plurality of ring resonator modulators 111 is greater than a spectral bandwidth of modes provided by plurality of ring resonator filters 109 to common optical output bus 105. Further each of filters 109 and modulators 111 each correspond to one frequency/mode of spectrum 451, and a number of filters 109 is equal to a number of modulators 111.

Hence, each modulator 111 can modulate a respective mode and/or frequency on common optical output bus 105 to produce a respective modulated optical signal on common optical output bus 105, which is output to optical fibers and the like via optical output device 115. Amplifiers 119 can hence cause Tx Data to be transmitted using system 100 by converting a plurality of data, to be transmitted, to respective Tx Data for controlling respective modulators 111 thereby encoding respective data in respective optical signals on different modes. By using one laser that produces all desired modes, filtering the desired modes using filters 109 onto common optical output bus 105, and modulating the modes using modulators 111 on common optical output bus 105, system 100 is generally free of multiplexers.

Figure 5:
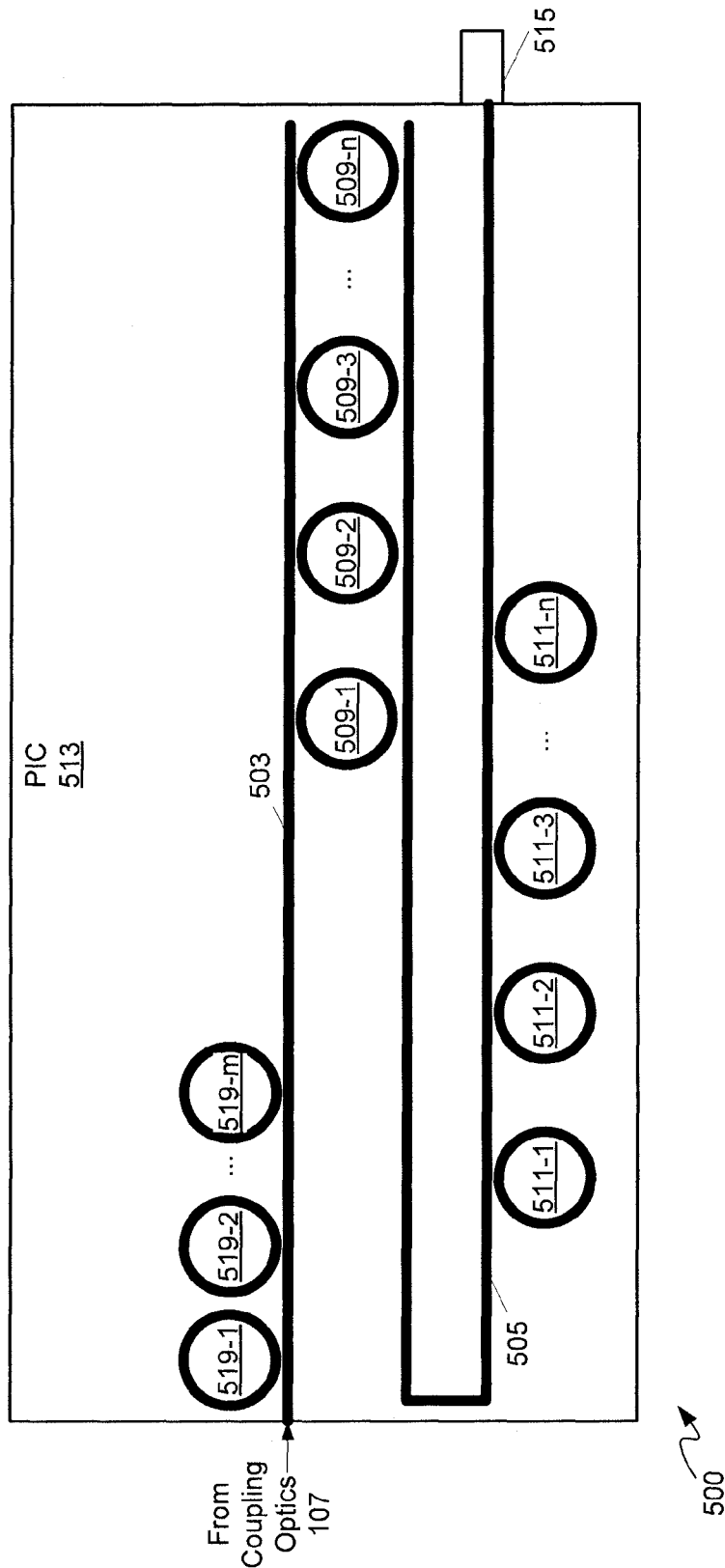
FIG. 5 depicts a schematic diagram of a plurality of filters and modulators of the system of FIG. 1, according to alternative non-limiting implementations.

Attention is next directed to FIG. 5, which depicts a non-limiting implementations of a system 500 comprising optical input bus 503, a common optical output bus 505, a plurality of ring resonator filters 509-1, 509-2, 509-3 . . . 509-$n$, a plurality of ring resonator modulators 511-1, 511-2, 511-3 . . . 511-$n$, and an optical output device 515 that can be used, respectively, in place of optical input bus 103, common optical output bus 105, filters 109, modulators 111, and optical output device 115 in FIG. 1. Plurality of ring resonator filters 509-1, 509-2, 509-3 . . . 509-$n$ will be interchangeably referred to hereafter, collectively, as filters 509 and generically as a filter 509. Similarly, plurality of ring resonator modulators 511-1, 511-2, 511-3 . . . 511-$n$ will be interchangeably referred to hereafter, collectively, as modulators 511 and generically as a modulator 511.

Indeed, each of optical input bus 503, common optical output bus 505, filters 509, modulators 511, and optical output device 115 are substantially similar, respectively to optical input bus 103, common optical output bus 105, filters 109, modulators 111, and optical output device 115. Further, optical input bus 503, common optical output bus 505, filters 509 and modulators 511 can be formed from a common PIC 513, as depicted, which can replace PIC 113 in FIG. 1. It is further assumed in FIG. 5 that each filter 509, 519 and each modulator 511 is in communication with a computing device similar to computing device 150, and each modulator 511 is in communication with a respective modulator amplifier similar to amplifiers 119. However, in contrast to PIC 113 of FIG. 1, system 500 further comprises a plurality of further ring resonator filters 519-1, 519-2 . . . 519-$m$ (interchangeably referred to hereafter, collectively, as further filters 519 and generically as a further filter 519) that are tuned using respective tuning apparatus (not depicted), similar to tuning apparatus 203, to block modes other than the sub-band of the given modes that correspond to filters 509, plurality of further ring resonator filters 519 located between coupling optics 107 and plurality of ring resonator filters 509, for example on optical input bus 103. It is appreciated that filters 519 are coupled to optical input bus 503 but not to common optical output bus 505.

It is assumed in FIG. 5 that coupling optics 107 couples modes from laser 101 to optical input bus 503 so that frequencies/modes corresponding to frequencies/modes of spectrum 301 are input to optical input bus 503. It is further assumed that each of filters 509 and modulators 511 each correspond to one frequency/mode of spectrum 451. Hence, a number of filters 509 is equal to a number of modulators 511.

It is further assumed that each further filter 519 is tuned to a frequency and/or mode of spectrum 301 that is not to be coupled to common optical output bus 505 by filters 509. In other words, further filters 519 remove respective modes from spectrum 301 to produce spectrum 401. Hence, a number "m" of filters 519 is equal to a number of modes of spectrum 301 that are removed and/or filtered from spectrum 301 to produce spectrum 401. Further, as described above, a number "n" of filters 509 is equal to a number "n" of modulators 511, where "n" is less than or equal to a number of modes that reach filters 509 from filters 519.

Thus further filters 519 have a similar functionality to an optional optical filter of coupling optics 107 and can be used in conjunction with an optical filter in coupling optics 107.

Figure 6:
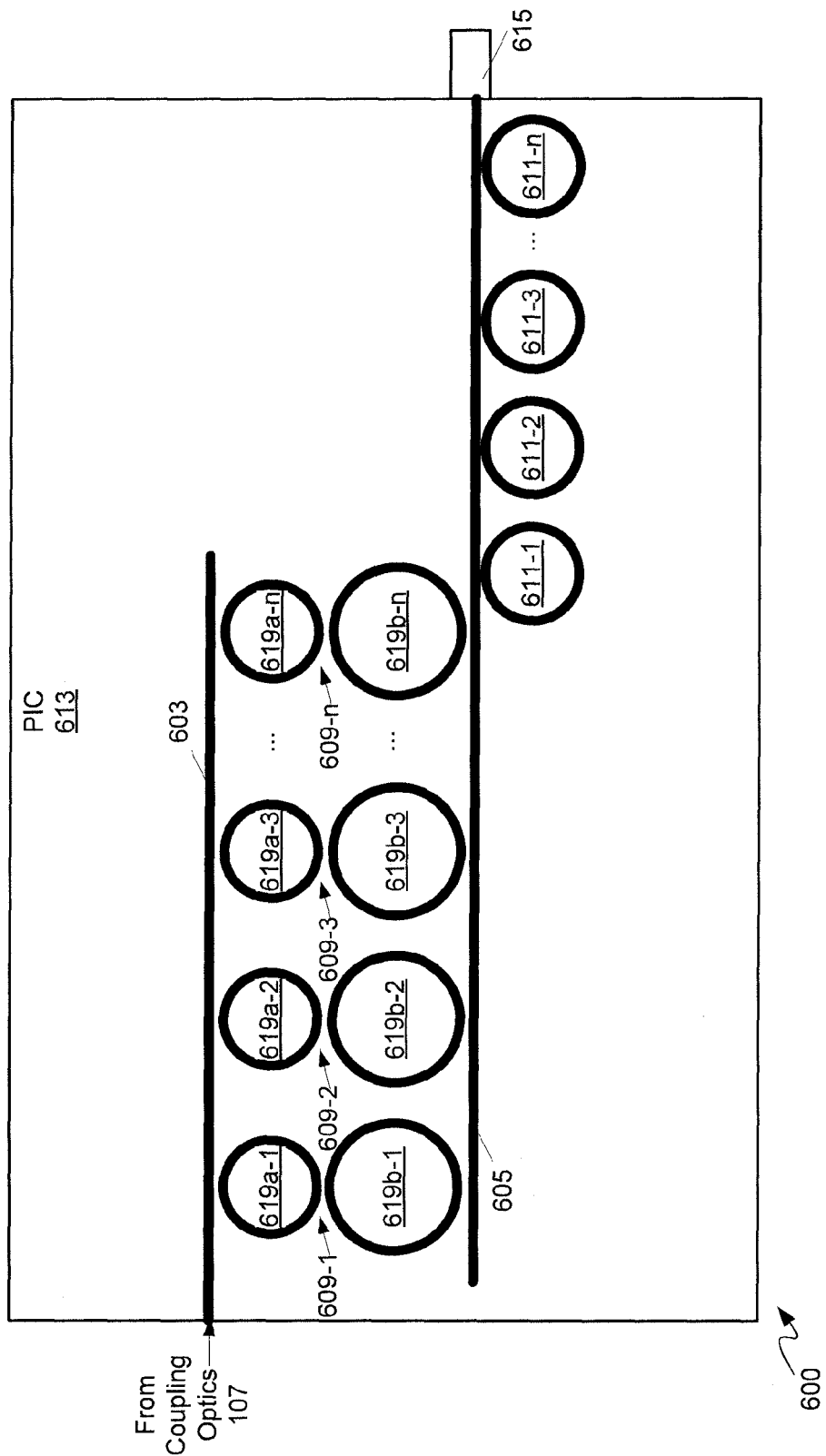
FIG. 6 depicts a schematic diagram of a filters and modulators of the system of FIG. 1, according to alternative non-limiting implementations.

Attention is next directed to FIG. 6, which depicts a non-limiting implementation of a system 600 comprising optical input bus 603, an common optical output bus 605, a plurality of Vernier filters 609-1, 609-2, 609-3 ... 609-n, a plurality of ring resonator modulators 611-1, 611-2, 611-3 ... 611-n, and an optical output device 615 that can be used, respectively, in place of optical input bus 103, common optical output bus 105, filters 109, modulators 111, and optical output device 115 in FIG. 1. Plurality of Vernier filters 609-1, 609-2, 609-3 ... 609-n will be interchangeably referred to hereafter, collectively, as Vernier filters 609 and generically as a Vernier filter 609. Similarly, plurality of ring resonator modulators 611-1, 611-2, 611-3 ... 611-n will be interchangeably referred to hereafter, collectively, as modulators 611 and generically as a modulator 611.

Indeed, each of optical input bus 603, common optical output bus 605, modulators 611, and optical output device 115 are substantially similar, respectively to optical input bus 103, common optical output bus 105, modulators 111, and optical output device 115. Further, optical input bus 603, common optical output bus 605, Vernier filters 609 and modulators 611 can be formed from a common PIC 613, as depicted, which can replace PIC 113 of FIG. 1. It is further assumed in FIG. 6 that each filter 609 and each modulator 611 is in communication with a computing device similar to computing device 150, and each modulator 611 is in communication with a respective modulator amplifier similar to amplifiers 119. However, in contrast to PIC 113 of FIG. 1, in system 600, each filter 109 is replaced with a tunable Vernier filter 609 comprising a respective first filter 619a-1, 619a-2, 619a-3, ... 619a-n having a first free spectral range (FSR) and a respective second filter 619b-1, 619b-2, 619b-3, ... 619b-n having a second FSR different from the first FSR, a combined FSR of the tunable Vernier filter being greater than a spectral bandwidth of the modes of laser 101. First filters 619a-1, 619a-2, 619a-3, ... 619a-n will be interchangeably referred to hereafter, collectively, as first filters 619a and generically as a first filter 619a. Second filters 619b-1, 619b-2, 619b-3, ... 619b-n will be interchangeably referred to hereafter, collectively, as second filters 619b and generically as a second filter 619b.

Furthermore, while each of first filter 619a and second filter 619b is depicted as being one respective ring resonator of different dimensions (e.g. different circumferences and/or different diameters), in other implementations, each of first filter 619a and second filter 619b can comprise one or more ring resonators. In other words, each Vernier filter 609 comprises two cascaded filters, each of which can be tuned using respective tuning apparatus (not depicted), similar to tuning apparatus 203.

Each second filter 619b is coupled to a respective first filter 619a using one or more of a drop port of the respective first filter 619a and a waveguide. As depicted, the coupling occurs using the drop port, but in other implementations, respective waveguides are provided between each first filter 619a and a respective second filter 619b to provide the coupling.

An FSR of each of filters 619a, 619b are different so that when respective resonant frequencies of each are aligned, for example by tuning each of filters 619a 619b of a given Vernier filter 609, one mode of laser 101 is coupled from optical input bus 603 to common optical output bus 605. Specifically, a combined FSR of a given Vernier filter 609 comprises:

$$\text{FSR\_vern} = M1 \times \text{FSR1} = M2 \times \text{FSR2} \qquad \text{Equation (1)}$$

where FSR_vern is the combined FSR, FSR1 is the FSR of a filter 619a, FSR2 is the FSR of a filter 619b, and each of M1 and M2 are different co-prime integers. In some implementations, M2=M1+1 is a further condition to prevent splitting of the main peak in the combined filter response.

Figure 7:
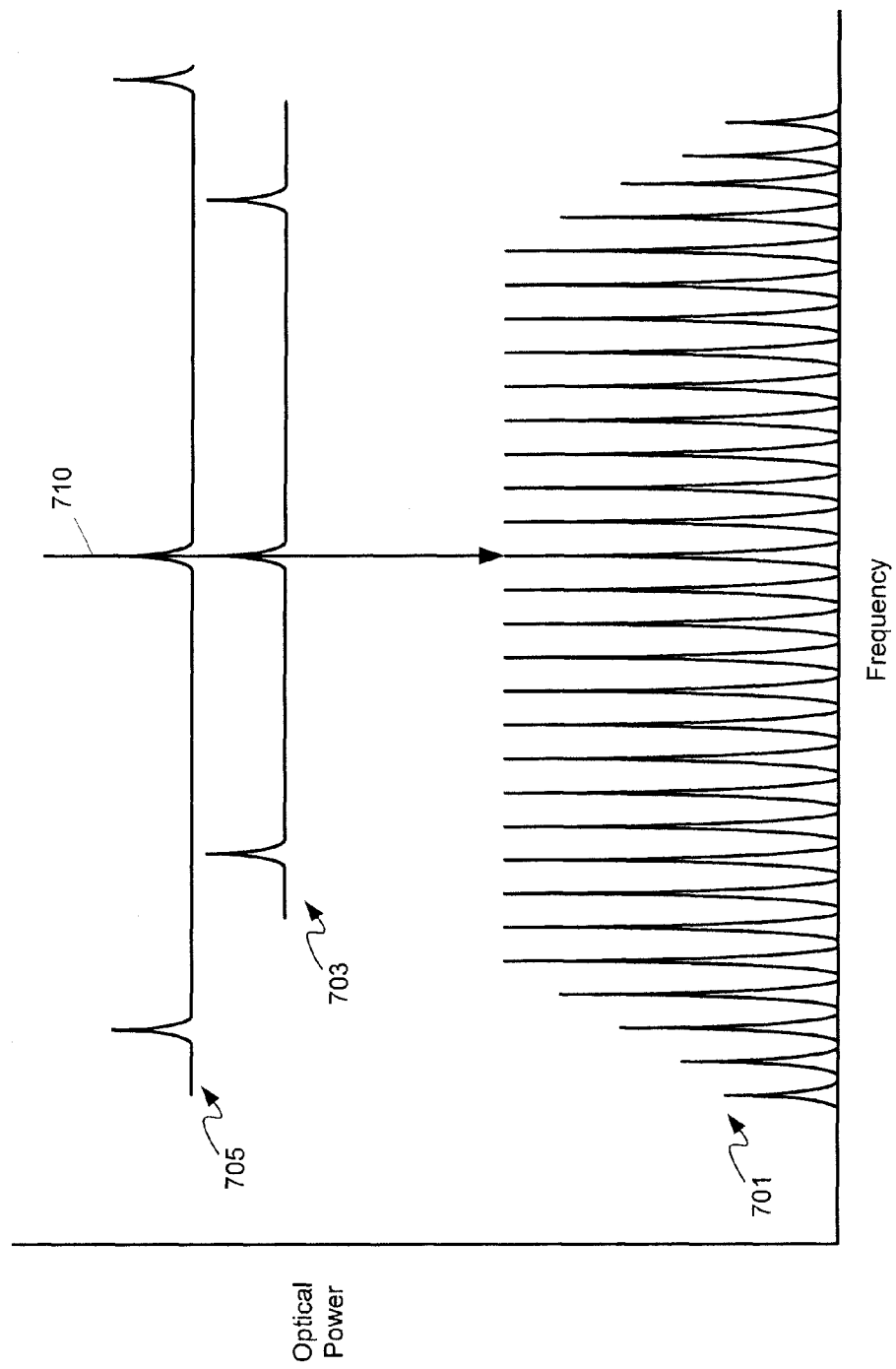
FIG. 7 depicts modes of the laser of FIG. 1, and transfer function of a Vernier filter of FIG. 6, according to non-limiting implementations.

Tuning of a Vernier filter 609 is illustrated in FIG. 7, which depicts an optical spectrum 701 of laser 101, similar to spectrum 301, a transfer function 705 of a first filter 619a, and a transfer function 703 of a second filter 619b. Transfer functions 703, 705 comprise different FSRs (i.e. different spacings between respective frequency peaks). In FIG. 7, it is assumed that filters 619a, 619b were tuned so that one respective mode of each transfer function 703, 705 for each aligns with each other and a mode of spectrum 701, for example along arrow 710, which provided merely as an annotation to FIG. 7. Hence, the Vernier filter 609 which has been tuned couples the corresponding frequency and/or mode of spectrum 301 from optical input bus 603 to common optical output bus 605 (i.e. the mode indicated by arrow 710).

Transfer functions 703, 705 further show that respective FSRs are different and a combined FSR is greater than a spectral bandwidth of laser 101. For example, while only one mode of each of transfer functions 703, 705 is aligned in FIG. 7, each of transfer functions 703, 705 comprise a plurality of modes, not all of which are depicted in FIG. 7. As the pattern in each of transfer functions 703, 705 repeats, two other modes will align at another point based on the respective frequency spacings. The frequency at which the two other modes align represents another frequency that could be filtered by Vernier filter 609; however as a frequency spacing between the depicted aligned modes and the other aligned modes is greater than a spectral bandwidth of laser 101, the Vernier filter 609 only couples one mode of laser 101 to common optical output bus 605.

In any event, provided herein are various implementations of a single laser multi-frequency transmitter in which modes of a quantum dot laser, a quantum dash laser, and the like, are coupled to a common optical output bus using a plurality of ring resonator filters, one for each mode that is coupled, arranged in series on an optical input bus. The filters are each tuned to couple a respective mode. Ring resonator modulators on the common optical output bus are controlled to modulate a respective mode to encode data therein. The transmitter has one laser, which reduces power usage compared to multi-laser transmitters. Furthermore, as modes of the laser are coupled through a common optical output bus, the transmitter is also free of multiplexer devices which increases power throughput compared to compared to multi-laser transmitters that use multiplexers.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A system comprising:
   a laser generating given modes;
   an optical input bus;
   a common optical output bus;
   coupling optics coupling the laser to the optical input bus;
   a plurality of ring resonator filters: arranged in series along the optical input bus in a one-to-one relationship with a sub-band of the given modes; optically coupled to both the optical input bus and the common optical output bus;

and each configured to couple one respective mode from the sub-band to the common optical output bus; and, a plurality of ring resonator modulators: arranged in series along the common optical output bus in a one-to-one relationship with the plurality of ring resonator filters; and each configured to modulate one given respective mode from the sub-band so that all modes in the sub-band are modulated on the common optical output bus.

2. The system of claim 1, wherein each of the plurality of ring resonator filters and each of the plurality of ring resonator modulators comprises one or more ring resonators.

3. The system of claim 1, wherein a respective free spectral range (FSR) of each of the plurality of ring resonator filters is greater than a spectral bandwidth of the modes on the optical input bus that reach of the plurality of ring resonator filters from the coupling optics.

4. The system of claim 1, wherein the plurality of ring resonator filters are configured to de-interleave the modes of the laser and the sub-band of the given modes comprises de-interleaved modes of the laser.

5. The system of claim 1, wherein a respective free spectral range (FSR) of each of the plurality of ring resonator modulators is greater than a spectral bandwidth of frequencies provided by of the plurality of ring resonator filters.

6. The system of claim 1, wherein the coupling optics comprises an optical filter that blocks modes other than the sub-band of the given modes.

7. The system of claim 1, further comprising, a plurality of further ring resonator filters that block modes other than the sub-band of the given modes, the plurality of further ring resonator filters located between the coupling optics and the plurality of ring resonator filters.

8. The system of claim 7, wherein each of the plurality of ring resonator filters comprises a respective bandwidth configured to couple the one respective mode from the sub-band to the common optical output bus.

9. The system of claim 1, wherein each of the plurality of ring resonator filters comprises a tunable Vernier filter comprising a respective first filter having a first free spectral range (FSR) and a respective second filter having a second FSR different from the first FSR, a combined FSR of the tunable Vernier filter being greater than a spectral bandwidth of the modes of the laser.

10. The system of claim 1, wherein each of the plurality of ring resonator filters comprises one or more optical ring resonators.

11. The system of claim 10, wherein the respective bandwidth is further configured to isolate the one respective mode from the sub-band.

12. The system of claim 10, wherein the second filter is coupled to the first filter using one or more of a drop port of the first filter and a waveguide.

13. The system of claim 12, wherein $M2=M1+1$.

14. The system of claim 11, wherein combined FSR (FSR_vern) of the tunable Vernier filter comprises:

$$FSR\_vern = M1 \times FSR1 = M2 \times FSR2$$

where FSR1 is the first FSR, FSR2 is the second FSR, and each of M1 and M2 are different co-prime integers.

15. The system of claim 1, wherein the laser comprises a quantum dot laser or a quantum dash laser.

16. The system of claim 1, wherein the modes of the laser align with a given channel of one or more of a telecommunication standard, a telecommunication specification, a data communication standard, and a data communication specification.

17. The system of claim 1, wherein the optical input bus, the common optical output bus, the plurality of ring resonator filters, and the plurality of ring resonator modulators are formed from a common photonic integrated circuit (PIC).

18. The system of claim 17, wherein, each at least one tuning apparatus comprises one or more of: at least one temperature control apparatus, at least one photodetector for optical signal sensing, at least one heater, at least one integrated heater, at least one cooler, and at least one thermoelectric cooler.

19. The system of claim 1, further comprising at least one respective tuning apparatus for each of the plurality of ring resonator filters and the plurality of ring resonator modulators.

20. The system of claim 1, further comprising an optical output device connected to the common optical output bus, the optical output device configured to convey an optical output signal to one or more of an optical component, an optical fiber, an SOA (Semiconductor Optical Amplifier), a PIC (photonic integrated circuit), and an optical filter.

* * * * *